United States Patent [19]

Schweitzer et al.

[11] Patent Number: 5,165,521
[45] Date of Patent: Nov. 24, 1992

[54] DIE EJECT SYSTEM FOR DIE BONDER

[75] Inventors: Karl Schweitzer, Mitte; Gerhard Zeindl, Munster, both of Austria

[73] Assignee: Emhart, Inc.

[21] Appl. No.: 900,559

[22] Filed: Jun. 18, 1992

Related U.S. Application Data

[63] Continuation of Ser. No. 661,916, Feb. 27, 1991, abandoned.

[30] Foreign Application Priority Data

Mar. 16, 1990 [GB] United Kingdom ............... 9006035

[51] Int. Cl.⁵ ............................................ B65G 29/00
[52] U.S. Cl. ............................ 198/477.1; 198/482.1; 198/345.2
[58] Field of Search ............ 198/482.1, 345.2, 378, 198/474.1, 477.1

[56] References Cited

U.S. PATENT DOCUMENTS

| | | | |
|---|---|---|---|
| 1,344,653 | 6/1920 | Rosengren | 198/345.2 |
| 2,956,664 | 10/1960 | Brown et al. | 198/482.1 X |
| 2,962,153 | 11/1960 | Brodbeck | 198/482.1 |
| 3,037,269 | 6/1962 | Barkstrom et al. | 198/482.1 X |
| 3,308,921 | 3/1967 | Bower | 198/345.2 |
| 3,378,129 | 4/1968 | Mancacci | 198/482.1 X |
| 4,158,405 | 6/1979 | Jackson | 198/482.1 X |
| 4,358,920 | 11/1982 | Kanai et al. | 198/482.1 X |

*Primary Examiner*—D. Glenn Dayoan
*Attorney, Agent, or Firm*—Spencer T. Smith

[57] ABSTRACT

A die eject system for a hybrid die bonder, in particular an automatic hybrid die bonder, comprises a support, on which a plurality of die eject heads are mounted. The die eject heads can be sequentially indexed into an operative position. The system has the advantage that it is possible to change rapidly from one head to another, either to eject different sizes of dice or in the case of damage to a die eject needle within a die eject head.

6 Claims, 4 Drawing Sheets

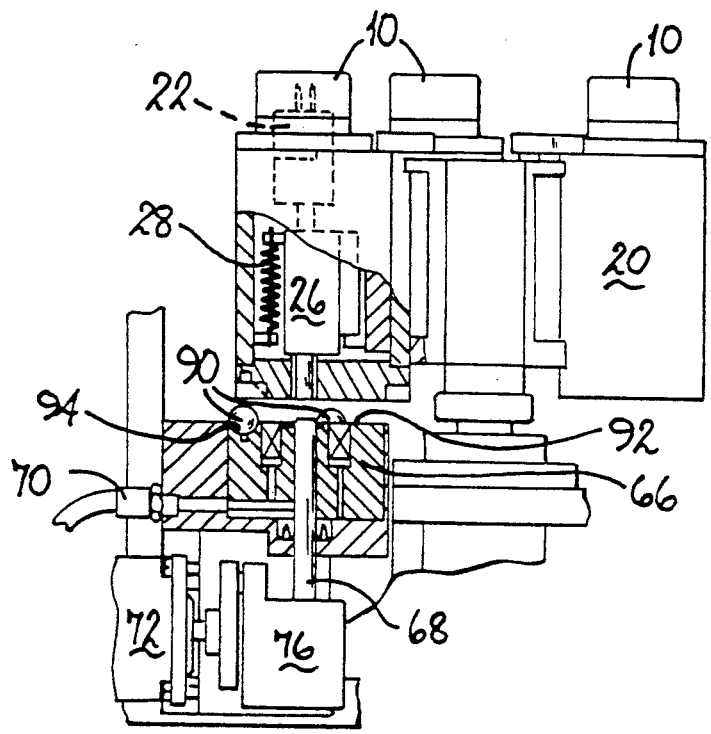
FIG_6

DIE EJECT SYSTEM FOR DIE BONDER

This is a continuation of co-pending application Ser. No. 07/661,916 filed on Feb. 27, 1991, now abandoned.

BACKGROUND OF THE INVENTION

The present invention relates to a die eject system for a hybrid die bonder, in particular an automatic hybrid die bonder.

A hybrid die bonder is used for bonding semiconductor dice of a range of different types and, in particular, sizes to a substrate. At the die eject stage, the die is ejected from a die presentation system, a number of different types of which are known and used, and picked up by an appropriate tool. The choice of die presentation system is determined principally by the size of the die, and available die presentation systems include wafer rings, film frames and waffle packs, each of which is available in different sizes.

The die presentation system is held in a holder which is transversed over a die eject head. Known die eject heads comprise a metal cap mounted on a bush. The metal cap is provided with one or more holes which extend through the thickness of the cap. One or more die eject needles are located within the bush, one needle being associated with each of the holes. The needles are mounted on a pin, and can be raised or lowered relative to the cap, so that the needle, in the raised position, projects by a predetermined amount through the hole, above the surface of the cap.

The number of needles, and hence holes in the cap is varied depending on the size of the die to be handled, and is generally one, two, three or four.

In known hybrid bonders, if it is desired to change from a first needle arrangement to an alternative arrangement, it is necessary to stop operation of the machine, remove the die eject head from the machine, remove the cap and the needle or needles, insert a new needle or needles, adjust the position and alignment of the new needle or needles relative to a centering point on the die eject head, replace the cap, re-insert the die eject head on the machine and then restart the machine. Such a complex series of operations necessarily takes a long time, and during the whole of this time the machine is not operating.

A similar series of operations has to be carried out if one of the needles becomes damaged or broken during operation of the machine.

It is an object of the present invention to provide a die eject system in which the above disadvantages are reduced or substantially obviated.

BRIEF SUMMARY OF THE INVENTION

The present invention provides a die eject system for a hybrid die bonder, in particular an automatic hybrid die bonder. An automatic hybrid die bonder, as shown in FIG. 1, comprises a die presentation system, shown generally at 104, a die eject station according to the present invention as shown generally at 104 and a die pick up and mounting system, which may be a die collet system (106) or an epoxy die bonder (108). A suitable die presentation system (102) is described and claimed in our copending U.S. patent application Ser. No. 661,915, filed Feb. 27, 1991 of even date herewith, and comprises a magazine (110) for storing a plurality of die presentation packages (112), a rotatable clamp assembly (114) comprising first and second clamp means (116,118) mounted on a rotatable support and each adapted to collect a selected die presentation package from the magazine (110), feed it to the die eject station (104) retrieve it from the die eject station after a predetermined number of dice have been ejected and return it to said magazine (110). The die presentation system (102) further comprises indexing means for indexing movement of the packages within the magazine (110) so that the selected package is located at a collection point for collection from the magazine.

After ejection at the die eject station (104), the die is picked up by a suitable pick-up and taken to a die mounting station. An automatic hybrid die bonder preferably comprises both a die collet mounting station (106) and an epoxy die bonding station (108). The die pick-up stage suitably comprises a tool exchange system such as that described and claimed in our copending U.S. patent application Ser. No. 661,888, filed Feb. 27, 1991 of even date herewith, which comprises a tool bank (120,122) comprising a plurality of tool holders (124,126) each fitted with a tool and adapted for pick-up by a head (128). The head (128) is mounted on a support and can be driven between the tool bank (120,122), the die eject station (104) according to the present invention and a die mounting station (106,108). The tool bank (120,122) can be driven to index a selected tool holder to a station at which it can be picked up by the head (128). The die eject system according to the present invention comprises a support, a plurality of die eject heads mounted on the support and means for indexing movement of the support to index the die eject heads successively into an operative position.

By using a die eject system according to the present invention, it is possible to handle dice varying in size from 200 microns square to 15 mm square, with the machine in continuous operation.

BRIEF DESCRIPTION OF THE DRAWINGS

Two preferred embodiments of a die eject system according to the invention will now be further described with reference to the accompanying drawings in which

FIG. 6 is a section, similar to that of FIG. 3, of a second embodiment of a die eject assembly according to the invention.

DETAILED DESCRIPTION

Figure 1:
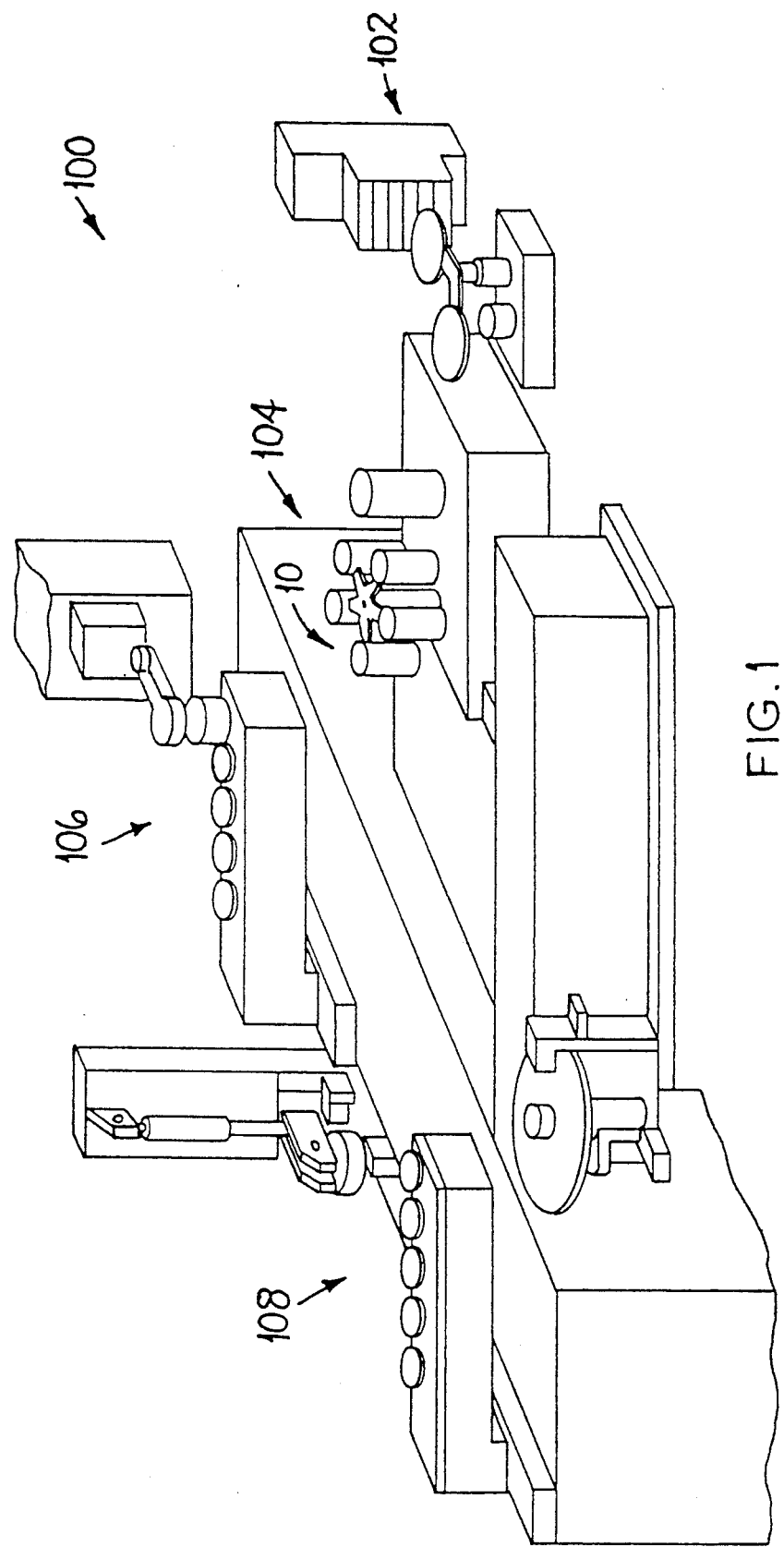
FIG. 1 is a perspective view of an automatic hybrid die bonder including a first embodiment of a die eject assembly according to the invention.
Figure 2:
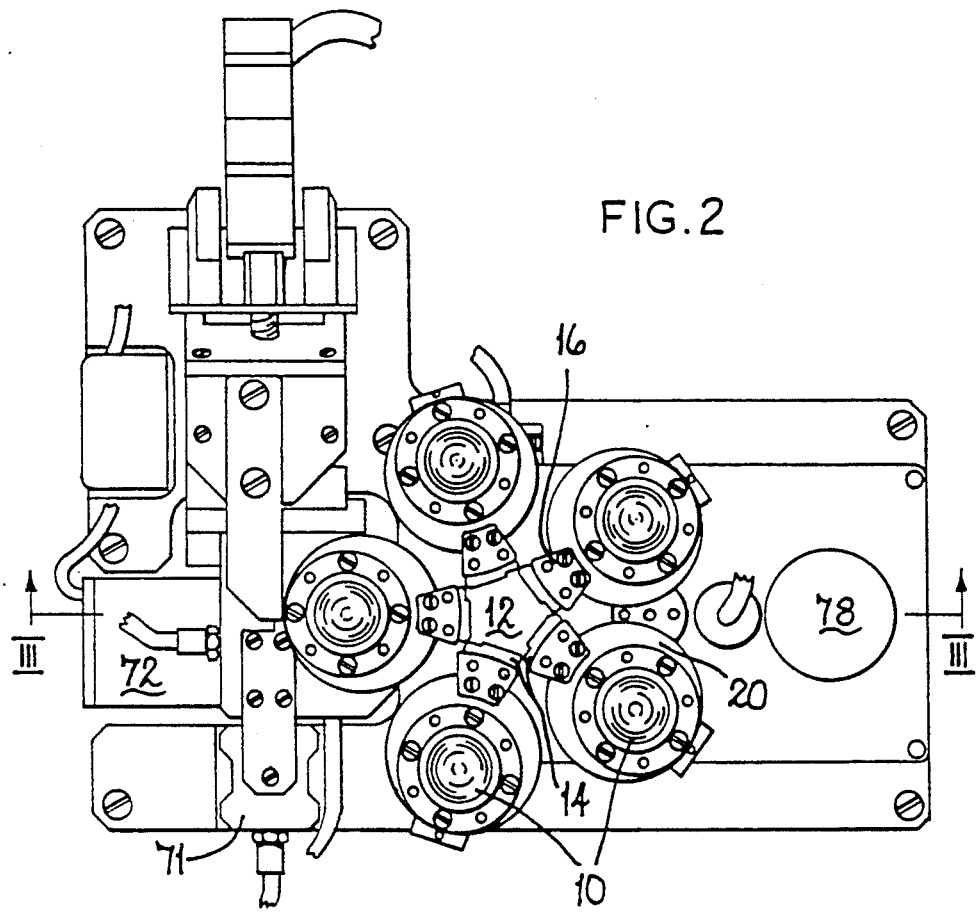
FIG. 2 is a plan view of a die eject assembly.
Figure 3:
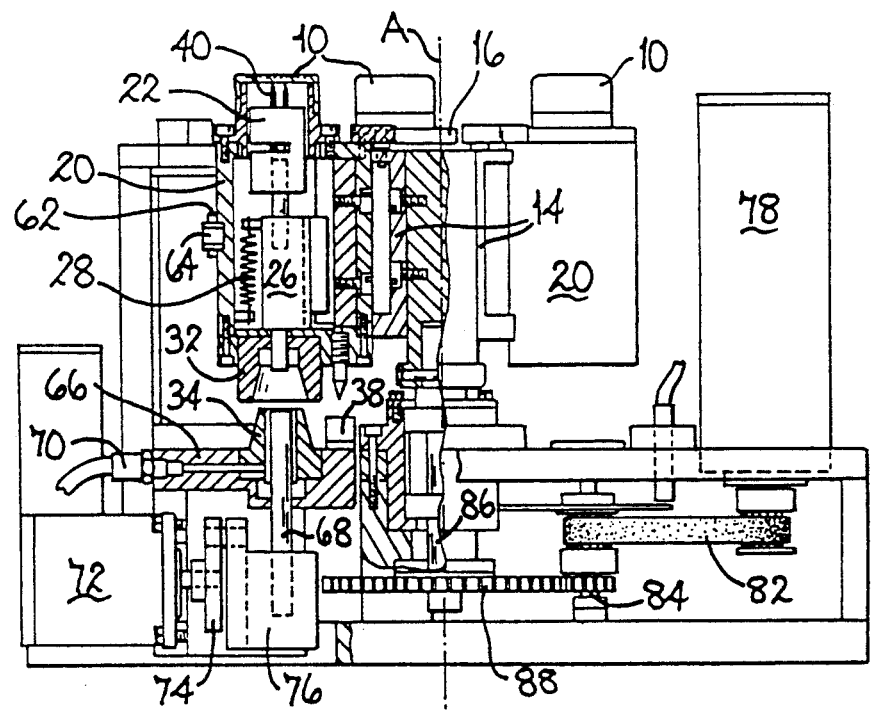
FIG. 3 is a section on the line III—III of FIG. 2.
Figure 4:
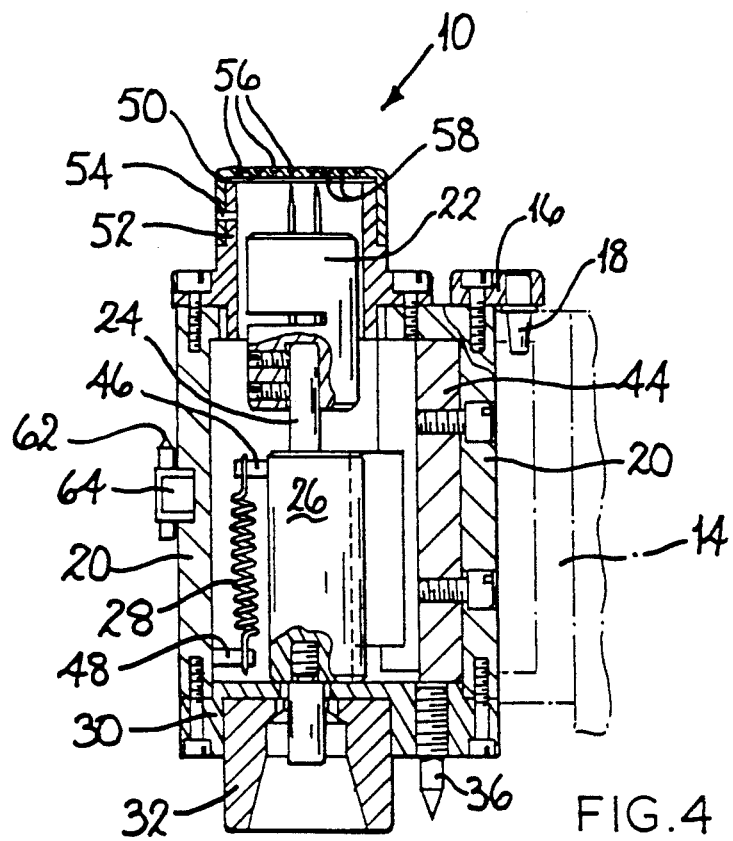
FIG. 4 is an enlarged view of a die eject head as shown in FIG. 3, in more detail.
Figure 5:
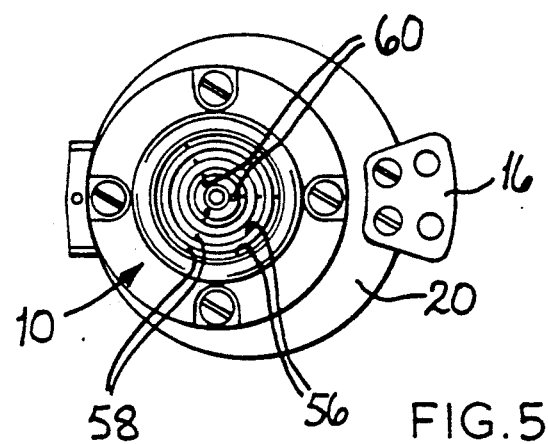
FIG. 5 is a plan view of a die eject head according to FIG. 4.

A die eject assembly (FIG. 2) comprises five die eject heads (10) mounted on a support (12) which is rotatable about a central axis (A). The five die eject heads (10) are spaced equiangularly about the support (12) and each is removably mounted on a support bracket (14). A centering mechanism comprises a centering support (16) (FIG. 4) fitted with a centering cone (18) which locates in a matching hole (not shown) in the bracket (14), is attached to a housing (20) of the die eject head (10), in which is slideably located a needle holder (22) mounted on the upper end of a pin (24). The lower end of the pin (24) is attached to a spring loaded carrier (26), which is biased towards a floor (30) of the housing by a tension spring (28) mounted on an upper securing bolt (46) attached to the carrier (26) and a lower securing bolt (48) attached to the inside wall of the housing (20). A centering unit (32) is secured in the housing floor (30) and co-operates with a centering bush (34) as shown in FIG. 3. A further centering pin (36) similarly locates in a pin centering unit (38). One or more die eject needles (40) are mounted in the needle holder (22) and secured by means of screws (not shown). Movement of the needle assembly comprising the needle or needles (40), needle holder (22), pin (24) and carrier (26) is guided by a mechanical guide (44) located within the housing (20).

A cap (50) is secured to a bush (52) at the top of the housing (20) by means of a screw (54). The upper surface of the cap (50) is provided in known manner with a network of grooves (56), holes (58) being associated with each of the grooves (56). These holes (58) extend through the thickness of the cap (50) and communicate with the inside of the housing (20) for evacuation. Additional holes (60) similarly extend through the thickness of the cap (50), one such hole being associated with and positioned vertically above each die eject needle (40).

A further centering pin (62) is mounted on the outside of the housing (20) by means of a block (64). This pin (62) is used in setting up the head outside the machine to determine the precise position of the needles relative to the fixed point of the pin, as will be explained in more detail later.

The head (10) is mounted on a support (12) which is rotatable about an axis (A). When the head (10) is in the operative position, it is located with its centering unit (32) and centering pin (36) vertically above a centering bush (34) and a pin centering unit (38) respectively. The centering bush (34) is mounted on a plate (66) on which the pin centering unit (38) is also mounted. A vertical cylindrical bore is provided centrally in the centering bush (34) and a rod (68) is slideably located within the bore. A vacuum connection (70) is provided so that the housing (20) of the die eject head (10) can be evacuated. A stepping motor (72) is connected by means of a disc (74) to a block (76) on which the rod (68) is mounted and can be controlled to cause vertical movement of the rod (68).

As mentioned above, the five die eject heads (10) are mounted on a support (12) which is rotatable about a central axis (A). A motor (78) is engaged by means of planetary gears (not shown) with a toothed belt (82) to drive a shaft (84) connected to a parallel shaft (86) by means of a spur wheel (88). The support (12) is mounted on the shaft (86) and is rotatable therewith.

In operation, two or more die eject heads (10) having the needle arrangements required for the particular dice to be handled, are mounted on the support (12). Prior to this mounting, the heads are inspected, and the x,y offset of the needles (40) relative to the pin (36) is recorded for each head. The offsets are then fed into the control system for the machine so that the exact location of needles is known, and the die presentation system can be suitably positioned so that a die is available for ejection.

The support (12) is rotated by means of the motor (78) and associated gearing, so that the selected head (10) is in the operative position of the die bonder machine (100). The head (10) is lifted by the air cylinder (71) and associated gearing so that the upper surface of the cap (50) is positioned immediately below and in contact with the under surface of the wafer (102). The vacuum connection (70) is then released and the chamber of the die eject head evacuated. The under surface of the wafer (102) is held down on the upper surface of the cap (50) by means of the vacuum applied, through the holes (58) and communicating network of grooves (56).

The needle assembly is then further raised against the spring (28) by the stepping motor (72) so that the needle or needles (40) project through the corresponding holes (60) in the top of the cap (50) by a predetermined amount. The die located above the needle or needles (40) is then ejected from the wafer (102) so that it can be picked up by the tool of the pick-up system (106, 108) and taken to the die collet station for mounting on a substrate.

The movement of the needles and their speed can be programmed.

A second embodiment of a die eject assembly according to the invention is shown in FIG. 6. In this embodiment, an alternative centering mechanism for centering the die eject head (10) on the rod (68) is provided.

Precise location of the die eject head (10) is achieved by means of a three point location system. Three spheres (90) are mounted, equiangularly spaced, in the upper surface (92) of the plate (66), in recesses (94) machined close to the outer edge of the upper surface. Three matching location points are provided on the lower surface of the head (10), spaced to mate with the spheres (90) when the head (10) is placed on the plate (66).

The first of these location points is a concave surface, which determines the x-y position of the head (10) relative to the plate (66); the second is a flat surface which determines the height of the head relative to the plate and the third is a triangular prism which determines the angular rotation of the head relative to the plate. Thus, in a simple manner, using a three point positioning system, the x-y position; angular rotation and height of the head relative to the plate can be precisely determined, reproducible to an accuracy of a few microns.

We claim:

1. A die eject system for a hybrid die bonder comprising a turret supporting a plurality of die eject heads,
each of said die eject heads including
a needle holder,
means for supporting said needle holder for vertical displacement,
means for supporting said turret for rotation about a vertical axis,
means for elevating one of said heads including means for locating said head at a selected angular position,
means for elevating said needle holder when said head is elevated.

2. A die eject system according to claim 1, wherein said locating means comprises a three point locating system.

3. A die eject system for a hybrid die bonder comprising a turret for supporting a plurality of die eject heads,
means for supporting said turret for rotation about a vertical axis,
said plurality of die eject heads each including
a needle holder,
means for supporting said needle holder for vertical displacement,
means for locating one of said plurality of die eject heads at a selected operative location, means for elevating a die eject head located at said selected operative location to a predetermined vertical height, means for removably securing said elevating means to said die eject head in a fixed and predetermined spatial relationship, and means for elevating said needle holder when said die eject head is elevated to said predetermined vertical position.

4. A die eject system for a hybrid die bonder according to claim 3, wherein said turret comprises means for removably supporting said die eject heads and each of said die eject heads comprises means for cooperating with said removably supporting means.

5. A die eject system for a hybrid die bonder according to claim 3 further comprising means for applying a vacuum to said elevated die eject head.

6. A die eject system for a hybrid die bonder according to claim 3, wherein said elevating means includes a stepping motor.

* * * * *